United States Patent [19]

Kaneko

[11] Patent Number: 4,476,490
[45] Date of Patent: Oct. 9, 1984

[54] HORIZONTAL SCANNING FREQUENCY MULTIPLYING CIRCUIT

[75] Inventor: Kenji Kaneko, Iwai, Japan

[73] Assignee: Victor Company of Japan, Ltd., Yokohama, Japan

[21] Appl. No.: 359,017

[22] Filed: Mar. 17, 1982

[30] Foreign Application Priority Data

Mar. 20, 1981 [JP] Japan ................................. 56-40553

[51] Int. Cl.$^3$ ............................................. H04N 5/04
[52] U.S. Cl. ................................................. 358/148
[58] Field of Search ................ 358/148, 183, 310, 335

[56] References Cited

U.S. PATENT DOCUMENTS 3,532,810 10/1970 Steinberg ............................. 178/7.3
4,232,339 11/1980 Smiley et al. ....................... 358/150

FOREIGN PATENT DOCUMENTS 2751021 12/1979 Fed. Rep. of Germany.
2946106 5/1980 Fed. Rep. of Germany.

*Primary Examiner*—Richard Murray
*Attorney, Agent, or Firm*—Ladas & Parry

[57] ABSTRACT

A horizontal scanning frequency multiplying circuit comprises a flip-flop supplied with a horizontal synchronizing signal having a horizontal scanning frequency $f_H$, which is set by this horizontal synchronizing signal, a phase-locked-loop, and a counter. The phase-locked-loop comprises a voltage controlled oscillator for producing a signal having a frequency $Nf_H$ (N is an integer over 1) which is N times the horizontal scanning frequency $f_H$, a frequency divider for frequency-dividing an output signal frequency of the voltage controlled oscillator, and a phase comparator supplied with one output signal of the flip-flop and an output signal of the frequency divider, for comparing phases of these signals and applying an output error signal to the voltage controlled oscillator to control the oscillation frequency of the voltage controlled oscillator. The counter is supplied with the other output signal of said flip-flop which is reset by this output signal, and supplied with the output signal of the voltage controlled oscillator within the phase-locked-loop as a clock signal, and produces a counted output every time the clock signal is counted for a predetermined counting time T, to supply this counted output to the flip-flop in order to reset the flip-flop. The voltage controlled oscillator within the phase-locked-loop produces a signal having a frequency $Nf_H$.

5 Claims, 3 Drawing Figures

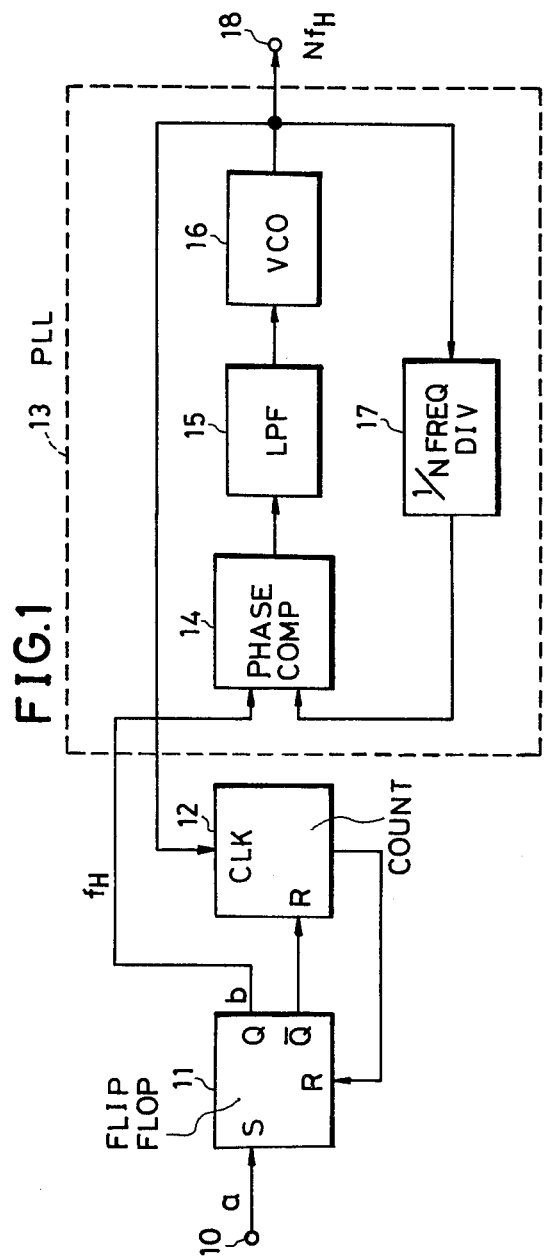
FIG.1
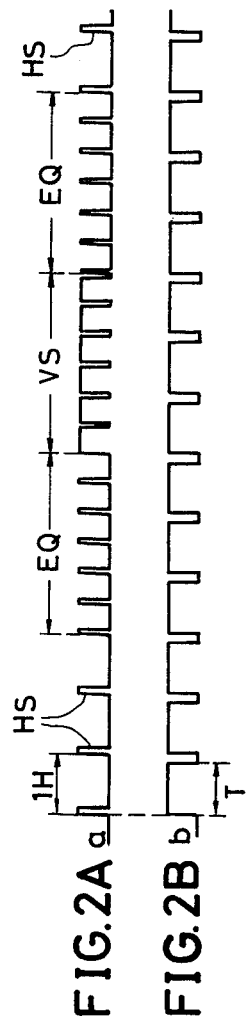
FIG.2A
FIG.2B

HORIZONTAL SCANNING FREQUENCY MULTIPLYING CIRCUIT

BACKGROUND OF THE INVENTION

The present invention generally relates to horizontal scanning frequency multiplying circuits, and more particularly to a horizontal scanning frequency multiplying circuit which synchronizes with the phase of a horizontal synchronizing signal within a composite synchronizing signal to obtain a signal having a frequency which is a multiple of the horizontal scanning frequency, and has a circuit construction which facilitates the circuit to be manufactured in the form of an integrated circuit (IC).

Generally, when recording an address signal of a pulse-code-modulated (PCM) signal format onto a rotary recording medium together with a video signal, this address signal is recorded within a horizontal blanking period having a predetermined order (predetermined positional relationship) from a starting position of each field of the video signal. In addition, when broadcasting a signal in which a signal for displaying characters is multiplexed with the video signal, for example, the PCM signal describing the characters is inserted within the horizontal blanking period of the video signal. When recording, reproducing, or transmitting the video signal inserted with the above kind of a PCM signal, it becomes necessary to obtain a signal having a frequency which is a multiple of the horizontal scanning frequency. Accordingly, a horizontal scanning frequency multiplying circuit is used.

The conventional horizontal scanning frequency multiplying circuit had the following circuit construction. That is, a composite synchronizing signal is supplied to a first monostable multivibrator wherein the composite synchronizing signal is converted into a pulse series having a pulse width corresponding to a distance between the rise (or fall) in the horizontal synchronizing signal within the composite synchronizing signal and a position approximately 3H/4 (H indicates one horizontal scanning period) from that rise (or fall) in the horizontal synchronizing signal, and having a repetition frequency equal to the horizontal scanning frequency. This pulse series thus obtained is supplied to a second monostable multivibrator, from which another pulse series having a horizontal scanning frequency $f_H$ is obtained. This pulse series obtained from the second monostable multivibrator does not respond to an equalizing pulse or a vertical synchronizing signal within the input composite synchronizing signal, and responds only to the horizontal synchronizing signal. The above pulse series of the frequency $f_H$ is supplied to a phase-locked-loop (PLL). The PLL comprises a voltage controlled oscillator (VCO) which oscillates at a frequency $Nf_H$ (N is an integer), a frequency divider for frequency-dividing an output oscillation frequency of the VCO, and a phase comparator for comparing phases of the output of the second monostable multivibrator and an output of the frequency divider, to supply an output error signal to the VCO and control the oscillation frequency of the VCO. A signal having a frequency $Nf_H$ which is N times the horizontal scanning frequency $f_H$, is accordingly obtained from the VCO.

However, the monostable multivibrator generally comprises a capacitor and a trimming variable resistor for finely adjusting the time constant. Hence, if the above described circuit as a whole is manufactured in the form of an integrated circuit, these capacitor and variable resistor must be provided exterior to the integrated circuit. This means that the number of pins of the integrated circuit is increased. Accordingly, the conventional horizontal scanning frequency multiplying circuit had a disadvantage in that it was not suited to be manufactured in the form of an integrated circuit. Furthermore, since the above fine adjustment must be performed during the manufacturing process, the productivity decreased.

SUMMARY OF THE INVENTION

Accordingly, it is a general object of the present invention to provide a novel and useful horizontal scanning frequency multiplying circuit in which the above described disadvantages have been overcome.

Another and more specific object of the present invention is to provide a horizontal scanning frequency multiplying circuit constructed only from a flip-flop, a counter, and a phase-locked-loop, which synchronizes with the phase of a horizontal synchronizing signal within a composite synchronizing signal to obtain a signal having a frequency which is a multiple of the horizontal scanning frequency. According to the circuit of the present invention, the horizontal scanning frequency multiplying circuit can easily be manufactured in the form of an integrated circuit, since a monostable multivibrator is not used as in the conventional circuit. Moreover, the productivity is high, since fine adjustments need not be performed during the manufacturing process.

Still another object of the present invention is to provide a horizontal scanning frequency multiplying circuit, in which a counting time T of the above counter is a value considering the time base deviation introduced by a jitter component in the horizontal synchronizing signal, and a value as close to a value of one horizontal scanning period as much as possible. The circuit according to the present invention is not affected by a vertical synchronizing pulse or an equalizing pulse, and the noise can be eliminated to a maximum.

Other objects and further features of the present invention will be apparent from the following detailed description when read in conjunction with the accompanying drawings.

BRIEF DESCRIPTION OF THE DRAWINGS

FIG. 1 is a systematic circuit diagram showing an embodiment of a horizontal scanning frequency multiplying circuit according to the present invention; and FIGS. 2A and 2B respectively show an input and an output signal of the flip-flop shown in FIG. 1.

DETAILED DESCRIPTION

In FIG. 1, a composite synchronizing signal a indicated in FIG. 2A is applied to a set terminal S of a flip-flop 11, through an input terminal 10. This composite synchronizing signal a is a composite synchronizing signal separated from a composite video signal which is reproduced from a recording medium such as a magnetic tape. As shown in FIG. 2A, the composite synchronizing signal comprises a horizontal synchronizing signal HS, an equalizing pulse EQ, and a vertical synchronizing signal VS. FIG. 2 shows a vertical blanking period and a part in the vicinity of the vertical blanking period, of the composite synchronizing signal. The above flip-flop 11 is set by the rise in the horizontal synchronizing signal within the composite synchronizing signal which is applied to the set terminal S.

An output $\bar{Q}$ of the flip-flop 11 is applied to a reset terminal R of a counter 12. When the flip-flop 11 is in a reset state, the output $\bar{Q}$ of the flip-flop 11 is of high level, and the counter 12 stops the counting operation. The counted value in the counter 12 is zero in this state. Hence, the counter 12 starts a counting operation from zero, when the horizontal synchronizing signal is applied to the input terminal 10. A signal having a frequency $Nf_H$ (N is an integer over 1, and $f_H$ is the horizontal scanning frequency. In the present embodiment of the invention, N=455, for example.) which is obtained from a voltage controlled oscillator (VCO) 16 within a phase-locked-loop (PLL) 13, is applied to a clock input terminal CLK of the counter 12.

The counter 12 counts the signal having the frequency $Nf_H$ which is applied to the input clock terminal CLK, and produces a counted output when a counting time of T seconds lapses. The counted output thus produced from the counter 12, is applied to the reset terminal R of the flip-flop 11, to reset the flip-flop 11. When the flip-flop 11 is reset, the counter 12 is also reset by the output $\bar{Q}$ of the flip-flop 11, and the counter 12 accordingly stops counting operation. The counting time T of the counter 12 is set to a value within a range described by $H/2 < T < H$ (H indicates one horizontal scanning period), so that effects are not introduced by the equalizing pulse EQ and the vertical synchronizing signal VS.

As described above, the flip-flop 11 is set and reset to produce a signal b indicated in FIG. 2B from an output terminal Q. This signal b is a pulse series having a pulse width T, and a repetition frequency which is equal to the horizontal scanning frequency $f_H$. The above signal b is in synchronism with the phase of the horizontal synchronizing signal HS, and is a pulse series having no relationships with the equalizing pulse EQ or the vertical synchronizing signal VS.

The output pulse series signal b of the flip-flop 11 is supplied to a phase comparator 14 within the PLL 13. Hence, the phaseses of the signal b and an output signal of a 1/N-frequency divider 17, are compared at the phase comparator 14. The output signal of the VCO 16 having the frequency $Nf_H$ is frequency-divided into 1/N the original frequency, at the 1/N-frequency divider 17, and supplied to the phase comparator 14 as a signal having a frequency $f_H$. An output error signal of the phase comparator 14 is applied to the VCO 16 through a lowpass filter 15, to control the oscillation frequency of the VCO 16. Accordingly, an output signal which is in synchronism with the phase of the horizontal synchronizing signal HS within the input composite synchronizing signal a, and having a frequency $Nf_H$ which is N times the horizontal scanning frequency $f_H$, is obtained from an output terminal 18.

In order not to be affected by the vertical synchronizing signal VS, the equalizing pulse EQ, and noise mixed within an interval wherein the horizontal synchronizing signal HS is not obtained, it is desirable to set the counting time T of the counter 12 to a value close to 1H interval as much as possible. On the other hand, however, when the input composite synchronizing signal a is a signal separated from a video signal which is reproduced from a recording medium such as a magnetic tape, the composite synchronizing signal a comprises a jitter component. Accordingly, if it is known beforehand that the horizontal synchronizing signal will deviate by $\pm \Delta t$ by the jitter component, for example, it is desirable to set the counting time T to a value slightly smaller than $H - \Delta t$. Therefore, by taking this into consideration, it is desirable to set the counting time T to a value within a range $H/2 < T < H$, and close to a value of 1H interval as much as possible without being affected by the jitter component.

Further, the present invention is not limited to these embodiments, but various variations and modifications may be made without departing from the scope of the present invention.

What is claimed is:

1. A horizontal scanning frequency multiplying circuit comprising:
    a flip-flop supplied with a horizontal synchronizing signal having a horizontal scanning frequency $f_H$, which is set by this horizontal synchronizing signal;
    a phase-locked-loop comprising a voltage controlled oscillator for producing a signal having a frequency $Nf_H$ (N is an integer over 1) which is N times the horizontal scanning frequency $f_H$, a frequency divider for frequency-dividing an output signal frequency of said voltage controlled oscillator, and a phase comparator supplied with one output signal of said flip-flop and an output signal of said frequency divider, for comparing phases of these signals and applying an output error signal to said voltage controlled oscillator to control the oscillation frequency of said voltage controlled oscillator; and
    a counter supplied with another output signal of said flip-flop which is reset by this output signal, and supplied with the output signal of the voltage controlled oscillator within said phase-locked-loop as a clock signal, for producing a counted output every time the clock signal is counted for a predetermined counting time T, to supply this counted output to said flip-flop in order to reset said flip-flop,
    said voltage controlled oscillator within said phase-locked-loop producing a signal having a frequency $Nf_H$.

2. A horizontal scanning frequency multiplying circuit as claimed in claim 1 in which said counting time T is selected to a value satisfying $H/2 < T < H$, where H indicates one horizontal scanning period.

3. A horizontal scanning frequency multiplying circuit as claimed in claim 1 in which said horizontal synchronizing signal constructs a composited synchronizing signal together with a verical synchronizing signal and an equalizing pulse, and said flip-flop is supplied with said composite synchronizing signal.

4. A horizontal scanning frequency multiplying circuit as claimed in claim 3 in which said composite synchronizing signal is a composite synchronizing signal separated from a composite video signal which is reproduced from a recording medium and having a jitter component, and said counting time T of said counter is selected to a value as close to 1H as much as possible without being affected by said jitter component.

5. A horizontal scanning frequency multiplying circuit as claimed in claim 1 in which said flip-flop, counter, and phase-locked-loop are manufactured in the form of an integrated circuit.

* * * * *